US 10,026,361 B2
(45) Date of Patent: Jul. 17, 2018

(12) United States Patent
Ho

(10) Patent No.: US 10,026,361 B2
(45) Date of Patent: Jul. 17, 2018

(54) PIXEL STRUCTURE

(71) Applicant: EverDisplay Optronics (Shanghai) Limited, Shanghai (CN)

(72) Inventor: Juiting Ho, Shanghai (CN)

(73) Assignee: EverDisplay Optronics (Shanghai) Ltd., Shanghai (CN)

(*) Notice: Subject to any disclaimer, the term of this patent is extended or adjusted under 35 U.S.C. 154(b) by 65 days.

(21) Appl. No.: 15/132,833

(22) Filed: Apr. 19, 2016

(65) Prior Publication Data

US 2016/0314746 A1    Oct. 27, 2016

(30) Foreign Application Priority Data

Apr. 24, 2015   (CN) .......................... 2015 1 0202894

(51) Int. Cl.
  *G09G 5/02*    (2006.01)
  *G09G 3/3266*  (2016.01)
  *G09G 3/3233*  (2016.01)
  *H01L 27/32*   (2006.01)

(52) U.S. Cl.
  CPC ......... *G09G 3/3266* (2013.01); *G09G 3/3233* (2013.01); *H01L 27/3265* (2013.01); *H01L 27/3276* (2013.01); *G09G 2300/0819* (2013.01); *G09G 2300/0842* (2013.01); *G09G 2300/0861* (2013.01)

(58) Field of Classification Search
  CPC ... G09G 2300/0819; G09G 2300/0842; G09G 2300/0861; G09G 3/3233; G09G 3/3266; H01L 27/3265; H01L 27/3276
  See application file for complete search history.

(56) References Cited

U.S. PATENT DOCUMENTS

| | | | | |
|---|---|---|---|---|
| 7,414,599 B2 * | 8/2008 | Chung | ................ | G09G 3/3233 315/169.3 |
| 8,674,905 B2 * | 3/2014 | Eom | ................ | G09G 3/3233 345/76 |
| 8,994,619 B2 * | 3/2015 | Jeong | ................ | G09G 3/3233 345/76 |
| 9,209,204 B2 * | 12/2015 | Wang | ................ | H01L 27/3297 |
| 9,276,050 B2 * | 3/2016 | Kwon | ................ | H01L 27/3262 |
| 9,450,040 B2 * | 9/2016 | Kim | ................ | H01L 27/3297 |
| 9,478,586 B2 * | 10/2016 | Lee | ................ | G09G 3/3233 |
| 9,620,579 B2 * | 4/2017 | Kim | ................ | H01L 29/66757 |
| 9,627,462 B2 * | 4/2017 | Kwon | ................ | H01L 27/3262 |
| 9,660,012 B2 * | 5/2017 | Kim | ................ | H01L 27/3297 |
| 9,748,321 B2 * | 8/2017 | Kim | ................ | H01L 27/3262 |

(Continued)

*Primary Examiner* — Michael J Jansen, II
(74) *Attorney, Agent, or Firm* — Wang Law Firm, Inc.

(57) ABSTRACT

A pixel structure includes a pixel unit layer and a first metal wire layer. Each of control signal line and first and second scan signal lines in the first metal wire layer is connected to each pixel unit in a corresponding row. An insulating layer is disposed between each first metal patterned section in the first metal wire layer and a corresponding row of pixel units. A second metal wire layer includes initial signal lines and second metal patterned sections. Each initial signal line is connected to each pixel unit in a corresponding row. Each second metal patterned section overlaps with one of the first metal patterned sections to form a capacitor. Each connection signal line in a third metal wire layer connects the first scan signal line of a current row of pixel units to the second scan signal line of a next row of pixel units.

8 Claims, 4 Drawing Sheets

(56) References Cited

U.S. PATENT DOCUMENTS

| | | | | |
|---|---|---|---|---|
| 9,842,543 B2* | 12/2017 | Zhou | G09G 3/3258 | |
| 9,899,464 B2* | 2/2018 | Kim | H01L 27/3276 | |
| 2005/0017934 A1* | 1/2005 | Chung | G09G 3/3233 | 345/82 |
| 2006/0103323 A1* | 5/2006 | Eom | G09G 3/3233 | 315/169.3 |
| 2012/0147060 A1* | 6/2012 | Jeong | G09G 3/3233 | 345/690 |
| 2013/0069852 A1* | 3/2013 | Liao | G09G 3/3233 | 345/77 |
| 2014/0034923 A1* | 2/2014 | Kim | H01L 27/3297 | 257/40 |
| 2014/0292622 A1* | 10/2014 | Lee | G09G 3/3233 | 345/80 |
| 2015/0001476 A1* | 1/2015 | Wang | H01L 27/124 | 257/40 |
| 2015/0243722 A1* | 8/2015 | Kwon | H01L 27/3262 | 257/40 |
| 2015/0255523 A1* | 9/2015 | Her | H01L 27/3262 | 345/76 |
| 2015/0279277 A1* | 10/2015 | Xu | G09G 3/3233 | 345/690 |
| 2016/0035282 A1* | 2/2016 | Lu | H05B 33/0896 | 315/291 |
| 2016/0141347 A1* | 5/2016 | Kwon | H01L 27/3262 | 257/40 |
| 2016/0189610 A1* | 6/2016 | Xiao | G09G 3/3233 | 345/77 |
| 2016/0190224 A1* | 6/2016 | Kim | H01L 27/124 | 257/40 |
| 2016/0253956 A1* | 9/2016 | Sagawa | G09G 3/3233 | 345/76 |
| 2016/0314742 A1* | 10/2016 | Zhou | G09G 3/3258 | |
| 2016/0314746 A1* | 10/2016 | Ho | G09G 3/3266 | |
| 2016/0358995 A1* | 12/2016 | Kim | H01L 27/3297 | |
| 2017/0012094 A1* | 1/2017 | Lee | G09G 3/3233 | |
| 2017/0033171 A1* | 2/2017 | Kim | H01L 27/3262 | |
| 2017/0200417 A1* | 7/2017 | Wu | G09G 3/3258 | |
| 2017/0256601 A1* | 9/2017 | Kim | H01L 27/3297 | |

* cited by examiner

1

PIXEL STRUCTURE

BACKGROUND OF THE INVENTION

The present invention relates to the display field and, more particularly, to a pixel structure including an organic light-emitting diode.

The development of organic light-emitting diodes (OLED) in recent years has received wide attention from the scientific research and development industry and the related industries. OLED displays have entered the lives of people. FIG. 1 shows a diagrammatic view of a conventional OLED pixel circuit. T2 designates a driving transistor for activating the OLED to emit light, Data designates a data signal line, En designates a control signal line, Sn, Sn−1, and Sn+1 designate scan signal lines, ELVDD designates the power source for providing the driving transistor T2 with a voltage to activate the OLED to emit light, ELVSS designates the grounding voltage, and Vin designates the initialization power source for providing the initialization voltage to the OLED and the gate (node N2) of the driving transistor T2. The voltage of Vin is lower than the voltage of ELVDD and the data voltage. FIG. 2 is a diagram showing a circuitry in a conventional pixel unit layer. Each row of pixel units is provided with the scan signal lines Sn+1, Sn, and Sn−1 and the control signal line En. Namely, the conventional pixel circuit includes three scan signal lines and a control signal line. The control signal lines En and the scan signal lines Sn+1, Sn, and Sn−1 are received in the sub pixel space between pixels. Since the four signal lines occupy most of the sub pixel space, the pixels per inch (PPI) is not high and, thus, adversely affects the image resolution.

BRIEF SUMMARY OF THE INVENTION

An objective of the present invention is to provide a pixel structure to solve the disadvantage of low PPI resulting from occupation of four signal lines in the sub pixel space in the conventional technique.

The technical problem is solved by a pixel structure according to the present invention. The pixel structure includes a pixel unit layer including a pixel unit array having a plurality of rows of pixel units and a plurality of columns of pixel units. A first metal wire layer includes a plurality of control signal lines, a plurality of first scan signal lines, a plurality of second scan signal lines, and a plurality of first metal patterned sections. Each of the plurality of control signal lines, the plurality of first scan signal lines, and the plurality of second scan signal lines is connected to each pixel unit in a corresponding row. Each of the plurality of first metal patterned sections is disposed above a corresponding row of pixel units. An insulating layer is disposed between each of the plurality of first metal patterned sections and the corresponding row of pixel units. A second metal wire layer includes a plurality of initial signal lines and a plurality of second metal patterned sections. Each of the plurality of initial signal lines is connected to each pixel unit in a corresponding row. A portion of each of the plurality of second metal patterned sections overlaps with one of the plurality of first metal patterned sections to form a first capacitor. A third metal wire layer includes a plurality of connection signal lines. Each of the plurality of connection signal lines connects the first scan signal line of a current row of pixel units to the second scan signal line of a next row of pixel units.

The first scan signal of the current row of pixel units is led by a corresponding connection signal line of the third metal wire layer to the second scan signal line of the next row of pixel units and severs as the second scan signal of the next row of pixel units. Thus, a scan signal line is omitted in the pixel structure according to the present invention in comparison with the conventional technique, reducing the number of signal lines occupying the sub pixel space and saving the space of the pixel unit layer. The PPI can be up to 6000. Thus, the OLED can have a higher resolution.

The increase in the PPI causes a reduction in the capacitance, leading to a higher demand in the integrated circuit. In this regard, a portion of each third metal patterned section in the third metal wire layer overlaps with one of the second metal patterned sections to form a second capacitor that is connected to one of the first capacitors in parallel to increase the effective capacitance of the pixel structure, reducing the demand burden to the integrated circuit by compensating the deficiency of reduced capacitance resulting from a high resolution.

The third metal wire layer can further include a plurality of third metal patterned sections. A portion of each of the plurality of third metal patterned sections overlaps with one of the plurality of second metal patterned sections to form a second capacitor connected to one of the first capacitors in parallel. An insulating layer is disposed between another portion of each of the plurality of third metal patterned sections not overlapped with a corresponding one of the plurality of second metal patterned sections.

The pixel structure can further include an insulating layer disposed between another portion of each of the plurality of second metal patterned sections not overlapped with a corresponding one of the plurality of first metal patterned sections.

The pixel structure can further include a control driving module mounted to a side of the pixel unit layer and connected to the plurality of control signal lines. The control driving module is configured to generate a control signal transmitted through one of the plurality of control signal lines to the corresponding row of pixel units.

The pixel structure can further include a scan driving module mounted to each of two sides of the pixel unit layer. The scan driving modules are connected to two ends of each of the plurality of first scan signal lines. Each scan driving module is configured to generate a scan signal transmitted through one of the plurality of first scan signal lines to a corresponding pixel unit.

The pixel structure can further include a substrate and a buffer register layer disposed on the substrate. The pixel unit layer, the first metal wire layer, the second metal wire layer, and the third metal wire layer are disposed on the buffer register layer. The pixel structure can further an insulating layer disposed on an upper face of the buffer register layer.

The pixel structure can further include a fourth metal wire layer having a plurality of data signal lines. Each of the plurality of data signal lines is connected to a corresponding column of pixel units.

The pixel structure can further include a data driving module mounted to a side of the pixel unit layer and connected to the plurality of data signal lines. The data driving module is configured to generate a data signal transmitted through one of the plurality of data signal lines to the pixel units in the corresponding column.

Each pixel unit in the pixel unit array can include a pixel circuit having a pre-charging module. The pre-charging module includes an input end connected to a light-emitting diode and an output end connected to a first electrode of a pre-charging transistor. The pre-charging transistor includes a second electrode connected to the plurality of initial signal lines. The pre-charging transistor further includes a gate connected to the plurality of second scan lines.

The primary objective of the present disclosure is providing a pixel structure comprising:

a pixel unit layer including a pixel unit array having a plurality of rows of pixel units and a plurality of columns of pixel units;

a first metal wire layer including a plurality of control signal lines, a plurality of first scan signal lines, a plurality of second scan signal lines, and a plurality of first metal patterned sections, wherein each of the plurality of control signal lines, the plurality of first scan signal lines, and the plurality of second scan signal lines is connected to each of the pixel units in a corresponding row, and each of the plurality of first metal patterned sections is disposed above a corresponding row of pixel units, and a first insulating layer is disposed between each of the plurality of first metal patterned sections and the corresponding row of pixel units;

a second metal wire layer including a plurality of initial signal lines and a plurality of second metal patterned sections, wherein each of the plurality of initial signal lines is connected to each of the pixel units in a corresponding row, and a portion of each of the plurality of second metal patterned sections is overlapped with one of the plurality of first metal patterned sections to form a first capacitor; and a third metal wire layer including a plurality of connection signal lines, wherein each of the plurality of connection signal lines is connected the first scan signal line of a current row of pixel units to the second scan signal line of a next row of pixel units.

Another objective of the embodiment of the present disclosure is that the third metal wire layer further comprises a plurality of third metal patterned sections, with a portion of each of the plurality of third metal patterned sections overlapped with one of the plurality of second metal patterned sections to form a second capacitor connected to one of the first capacitors in parallel, and with a second insulating layer disposed between another portion of each of the plurality of third metal patterned sections which is not overlapped with a corresponding one of the plurality of second metal patterned sections.

Another objective of the embodiment of the present disclosure is that a third insulating layer disposed between another portion of each of the plurality of second metal patterned sections which is not overlapped with a corresponding one of the plurality of first metal patterned sections.

Another objective of the embodiment of the present disclosure is that a control driving module mounted to a side of the pixel unit layer and connected to the plurality of control signal lines, wherein the control driving module is configured to generate a control signal transmitted through one of the plurality of control signal lines to the corresponding row of pixel units.

Another objective of the embodiment of the present disclosure is that a scan driving module mounted to each of two sides of the pixel unit layer, wherein the scan driving modules is connected to two ends of each of the plurality of first scan signal lines to generate a scan signal transmitted through one of the plurality of first scan signal lines to a corresponding pixel unit.

Still another objective of the embodiment of the present disclosure is that a substrate and a buffer register layer disposed on the substrate, wherein the pixel unit layer, the first metal wire layer, the second metal wire layer, and the third metal wire layer are disposed on the buffer register layer.

Another objective of the embodiment of the present disclosure is that a second insulating layer disposed on an upper surface of the buffer register layer.

Another objective of the embodiment of the present disclosure is that a fourth metal wire layer including a plurality of data signal lines, wherein each of the plurality of data signal lines connected to a corresponding column of the pixel units.

Still another objective of the embodiment of the present disclosure is that a data driving module mounted to a side of the pixel unit layer and connected to the plurality of data signal lines, wherein the data driving module is configured to generate a data signal transmitted through one of the plurality of data signal lines to the pixel units in the corresponding column.

Another objective of the embodiment of the present disclosure is that each of the pixel units in the pixel unit array includes a pixel circuit having a pre-charging module, with the pre-charging module including an input end connected to a light-emitting diode and an output end connected to a first electrode of a pre-charging transistor, with the pre-charging transistor including a second electrode connected to the plurality of initial signal lines, and with the pre-charging transistor further including a gate connected to the plurality of second scan lines.

The present invention will be further described in connection with the accompanying drawings and specific embodiments.

DETAILED DESCRIPTION OF THE INVENTION

The present invention will be described further in connection with the accompanying drawings and specific embodiments.

Figure 3:
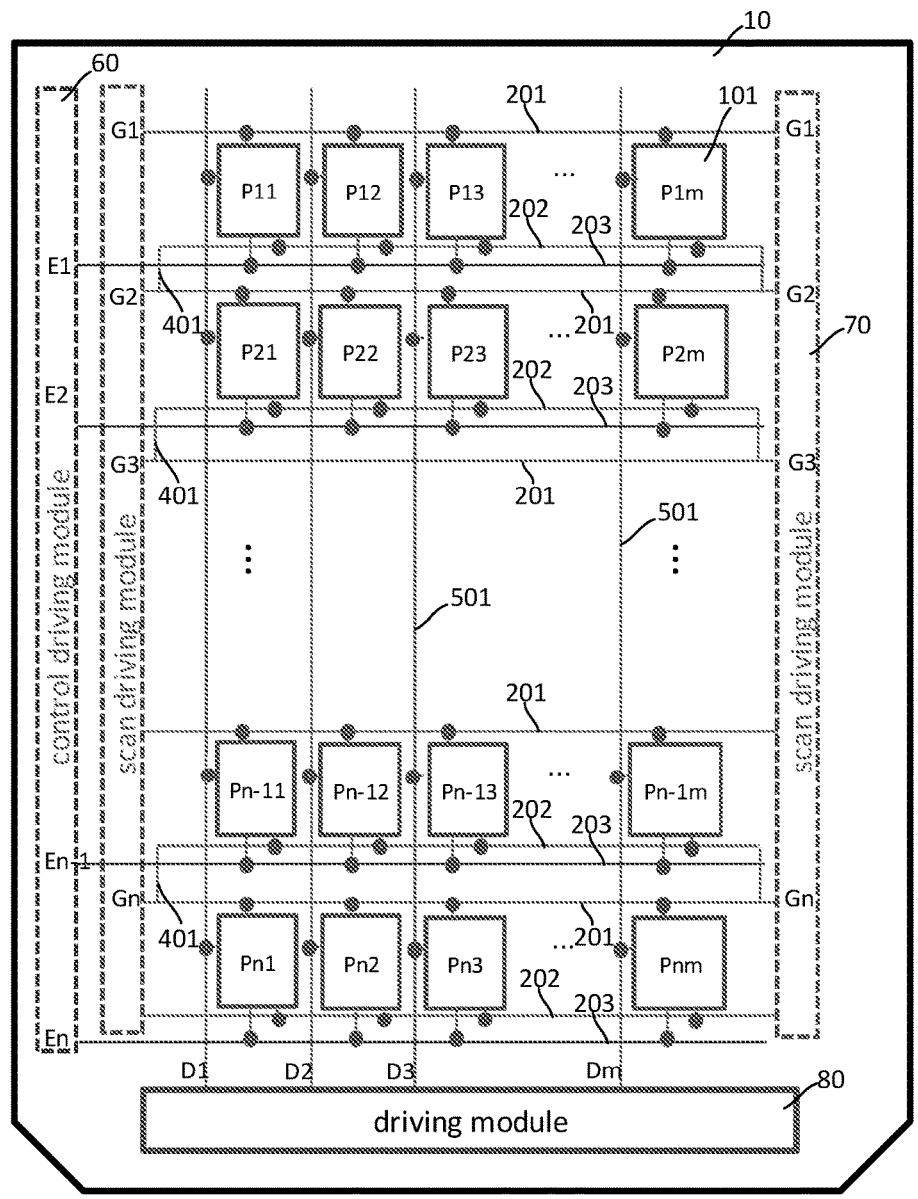
FIG. 3 is a gate driver on array circuit of a pixel structure according to the present invention.

FIG. 3 is a gate driver on array (GOA) circuit of a pixel structure according to the present invention. The pixel structure includes a pixel unit layer 10 including a pixel unit array having a plurality of rows of pixel units 101 and a plurality of columns of pixel units 101. Each row of pixel units 101 and each row of pixel units 101 extend in a horizontal direction and a vertical direction, respectively.

Figure 5:
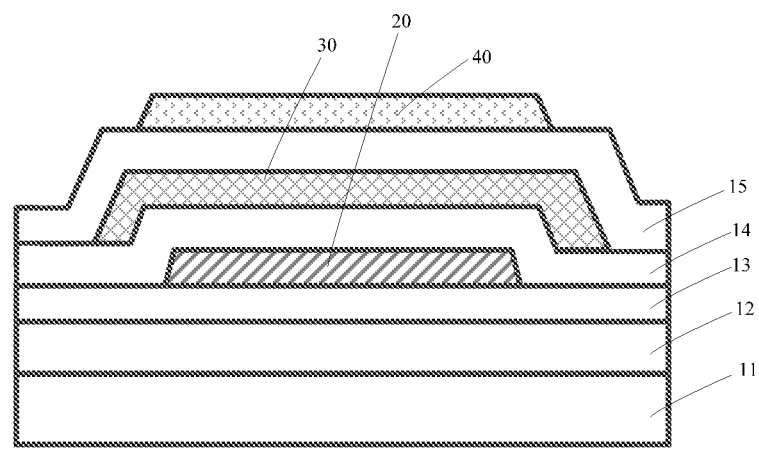
FIG. 5 is a cross sectional view of the circuitry in the pixel unit layer of the pixel structure according to the present invention.

With reference to FIG. 5, the pixel structure further includes a first metal wire layer 20, a second metal wire layer 30, and a third metal wire layer 40.

Figure 4:
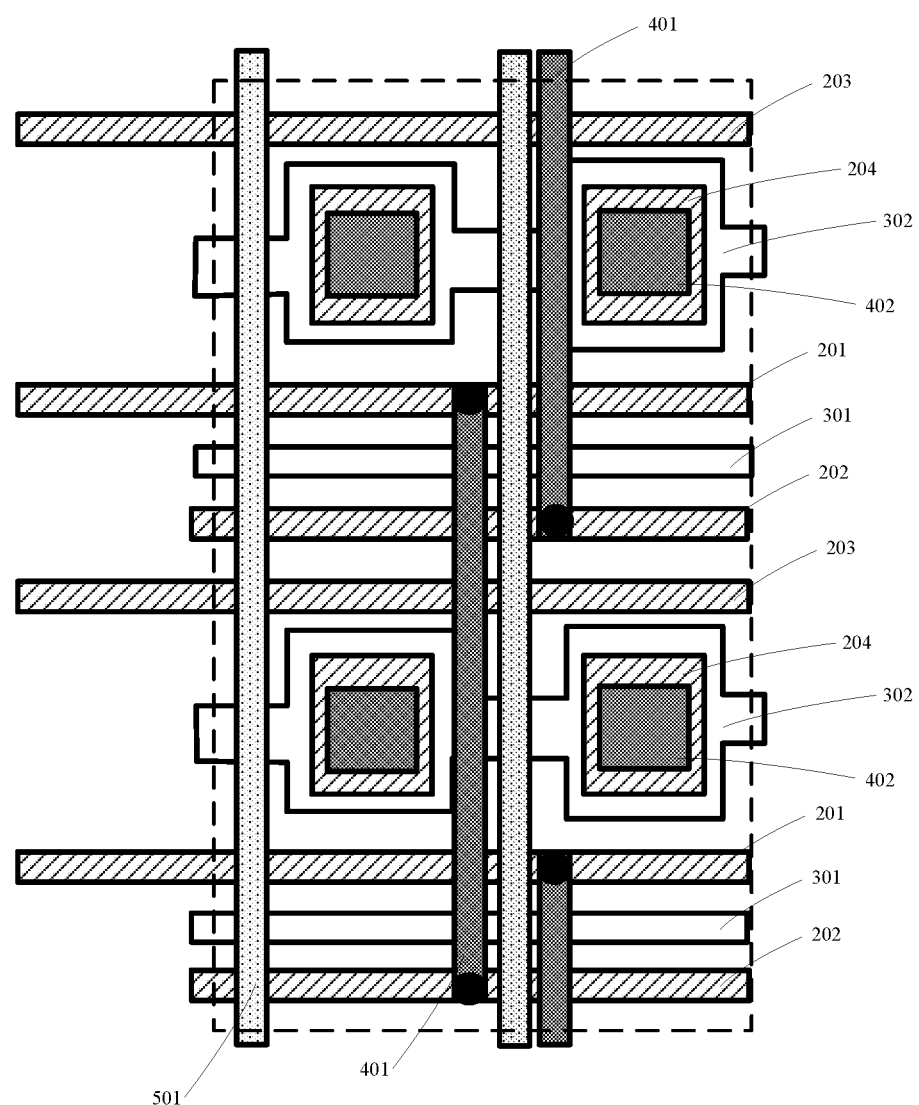
FIG. 4 is a diagram showing a circuitry in a pixel unit layer of the pixel structure according to the present invention.

With reference to FIG. 4, the first metal wire layer 20 includes a plurality of control signal lines 203, a plurality of first scan signal lines 201, a plurality of second scan signal lines 202, and a plurality of first metal patterned sections 204. Each of the control signal lines 203, the first scan signal lines 201, and the second scan signal lines 202 is connected to each pixel unit 101 in a corresponding row. The control signal lines 203 transmit control signals to each pixel unit 101 in the corresponding row. The first scan signal lines 201 and the second scan signal lines 202 transmit signal lines to each pixel unit 101. The pixel units 101 are activated by the control signals and the scan signals to proceed with the display function. Each first metal patterned section 204 is disposed above a corresponding row of pixel units 101. An insulating layer is disposed between each first metal patterned section 204 and the corresponding row of pixel units 101.

The second metal wire layer 30 includes a plurality of initial signal lines 301 and a plurality of second metal patterned sections 302. Each initial signal line 301 is connected to each pixel unit 101 in a corresponding row. A portion of each second metal patterned section 302 overlaps with one of the first metal patterned sections 204 to form a first capacitor. An insulating layer 14 is disposed between another portion of each second metal patterned section 302 not overlapped with a corresponding first metal patterned section 204.

The third metal wire layer 40 includes a plurality of connection signal lines 401 and a plurality of third metal patterned sections 402. Each connection signal line 401 connects the first scan signal line 201 of the current row of pixel units 101 to the second scan signal line 202 of the next row of pixel units 101. Thus, each connection signal line 401 leads the scan signal of the current row of pixel units 101 into the second scan signal line 202 of the next row of pixel units 101 to proceed with scanning of the pixel units 101 in the next row. A portion of each third metal patterned section 402 overlaps with one of the second metal patterned sections 302 to form a second capacitor. An insulating layer 15 is disposed between another portion of each third metal patterned section 402 not overlapped with a corresponding second metal patterned section 302. Each second capacitor is connected to one of the first capacitors in parallel to increase the effective capacitance of the pixel structure, reducing the demand burden to the integrated circuit.

Each first scan signal line 210 is used to transmit a scan signal Sn. Each second scan signal line 202 is used to transmit a scan signal Sn−1. Each control signal line 203 is used to transmit a control signal En. With reference to FIG. 3, the pixel structure further includes a control driving module 60 and two scan driving modules 70. The control driving module 60 is mounted to a side of the pixel unit layer 10 and is connected to the control signal lines 203. The control driving module 60 is configured to generate a control signal transmitted through one of the control signal lines 203 to the corresponding row of pixel units 101. The scan driving modules 70 are mounted to two sides of the pixel unit layer 10 and are connected to two ends of each first scan signal line 201. Each scan driving module 70 is configured to generate a scan signal (G1 . . . Gn) and provides the scan signal Gn to the first scan signal line 201 of each row of pixel units 101, and the scan signal (G1 . . . Gn) is transmitted through the first scan signal line 201 to the corresponding pixel unit 101. The first scan signal line 201 of the first row of pixel units 101 and the second scan signal line 202 of the second row of pixel units 101 are connected by a connection signal line 401, such that the scan signal (G1 . . . Gn) of the first row of pixel units 101 is led into the second scan signal line 202 of the second row of pixel units 101 and serves as the scan signal (Gn−1) for the second row of pixel units 101. Such an arrangement does not have to include the scan signal (Gn+1) in comparison with the conventional technique and, thus, reduces the occupied sub pixel space, increasing the PPI of the pixel arrangement and increasing the resolution.

With reference to FIG. 5, the pixel structure further includes a substrate 11 and a buffer register layer 12 disposed on the substrate 11. The pixel unit layer 10, the first metal wire layer 20, the second metal wire layer 30, and the third metal wire layer 40 are disposed on the buffer register layer 12. An insulating layer 13 is disposed on an upper face of the buffer register layer 12. In the example shown, the insulating layer 13 is disposed between the buffer register layer 12 and the first metal wire layer 20.

With reference to FIG. 4, the pixel structure further includes a fourth metal wire layer having a plurality of data signal lines 501. Each data signal line 501 is connected to each pixel unit 1010 in a corresponding column. Each row of pixel units 101 is connected to one of the data signal lines 501. With reference to FIG. 3, a data driving module 80 is mounted to a bottom side of the pixel unit layer 10 and is connected to the data signal lines 501. The data driving module 80 is configured to generate a data signal Data transmitted through one of the data signal lines 501 to the pixel units 101 in the corresponding column.

Figure 1:
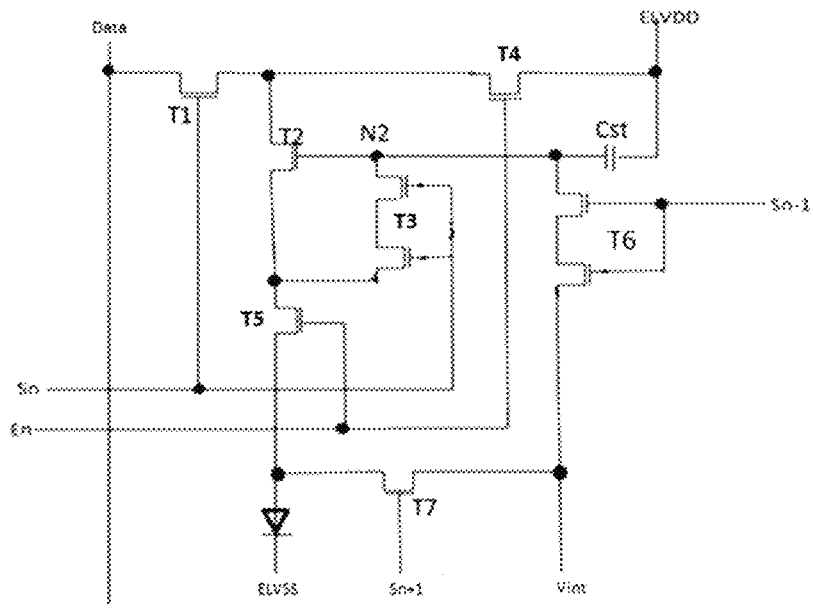
FIG. 1 is a diagrammatic view of a conventional OLED pixel circuit.
Figure 2:
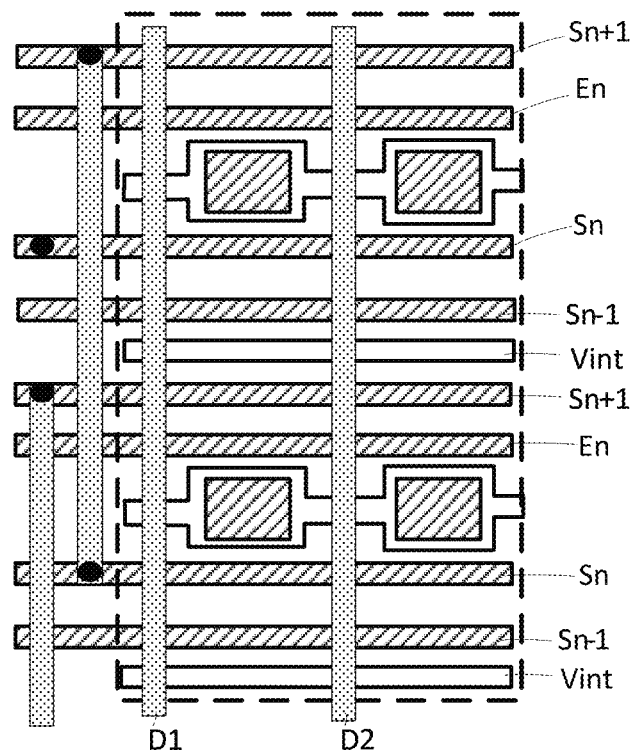
FIG. 2 is a diagram showing a circuitry in a conventional pixel unit layer.
Figure 6:
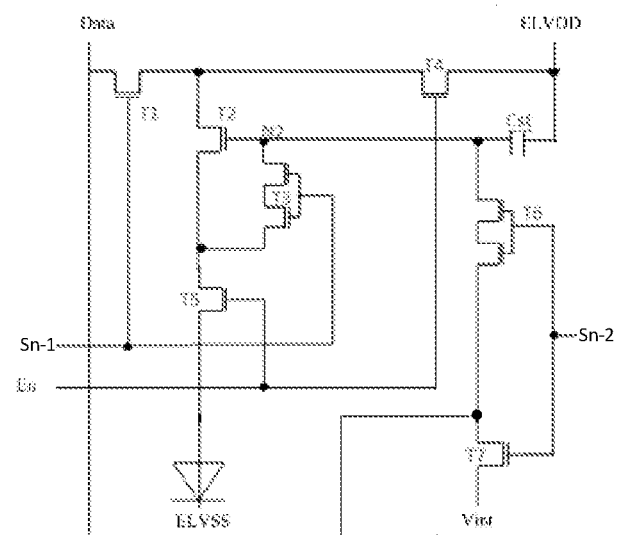
FIG. 6 is a diagrammatic view of the circuit in the pixel unit of the pixel structure according to the present invention.
Figure 6:
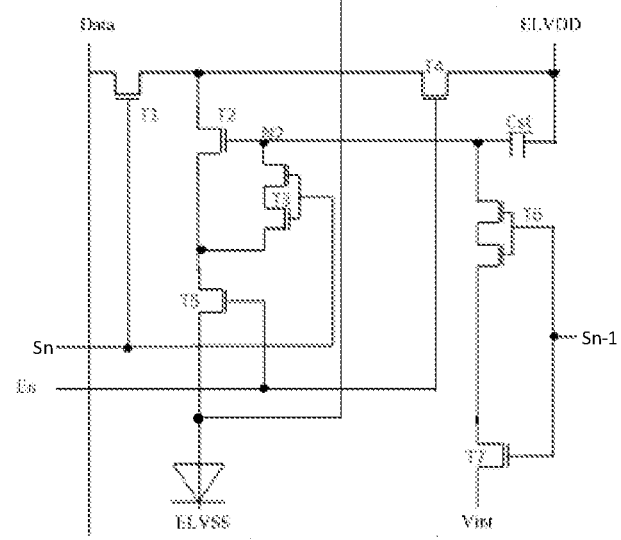

FIG. 6 is a diagrammatic view of the circuit in the pixel unit of the pixel structure according to the present invention. In comparison with the conventional OLED pixel circuit of FIG. 1, the pixel structure according to the present invention does not include the scan signal Sn+1. In the conventional OLED pixel circuit of FIG. 1, the scan signal Sn+1 is used to pre-charge a light-emitting diode. By omitting the scan signal Sn+1, the pixel structure according to the present invention saves the sub pixel space in the pixel unit layer 10 to provide additional space for increased number of pixel units 101, providing a pixel arrangement with a high PPI. In the example shown, a pre-charge module is provided in the pixel circuit of each pixel unit 101 of the pixel unit array according to the present invention and is connected to a pre-charging transistor which is a transistor T7 in the example shown. A gate of the transistor T7 is connected to the second scan signal line (namely, the scan signal Sn−1). A first electrode of the transistor T7 is connected to the pre-charging module. A second electrode of the transistor T7 is connected to the initial signal line 301 (namely, the initial signal Vint). The pre-charging module includes an input end connected to the light-emitting diode and an output end connected to the first electrode of the transistor T7. By controlling the scan signal Sn−1, the voltage of the initial signal Vint is inputted to the anode of the light-emitting diode to pre-charge the light-emitting diode.

The pixel structure according to the present invention includes several advantageous effects. The first scan signal Sn of the current row of pixel units 101 is led by a corresponding connection signal line 401 of the third metal wire layer 40 to the second scan signal line 202 of the next row of pixel units 101 and severs as the second scan signal Sn−1 of the next row of pixel units 101. Thus, a scan signal line Sn+1 is omitted in the pixel structure according to the present invention in comparison with the conventional technique, reducing the number of signal lines occupying the sub pixel space and saving the space of the pixel unit layer 10. The PPI can be up to 6000. Thus, the OLED can have a higher resolution.

The increase in the PPI causes a reduction in the capacitance, leading to a higher demand in the integrated circuit. In this regard, a portion of each third metal patterned section 402 in the third metal wire layer 40 overlaps with one of the second metal patterned sections 302 to form a second capacitor that is connected to one of the first capacitors in parallel to increase the effective capacitance of the pixel structure, reducing the demand burden to the integrated circuit by compensating the deficiency of reduced capacitance resulting from a high resolution.

The pixel structure according to the present invention increases the storage capacitance in a limited sub pixel space, saving the sub pixel space and providing a pixel arrangement with a high PPI.

Although the invention has been described in connection with the embodiments shown in the accompanying drawings, a person having ordinary skill in the art can make various modifications to the invention based on the above descriptions. Therefore, some details of the embodiment should not be construed to restrict the invention. The scope of the invention is limited by the accompanying claims.

The invention claimed is:

1. A pixel structure comprising:
a pixel unit layer including a pixel unit array having a plurality of rows of pixel units and a plurality of columns of pixel units;
a first metal wire layer including a plurality of control signal lines, a plurality of first scan signal lines, a plurality of second scan signal lines, and a plurality of first metal patterned sections, wherein each of the plurality of control signal lines, the plurality of first scan signal lines, and the plurality of second scan signal lines is connected to each of the pixel units in a corresponding row, and each of the plurality of first metal patterned sections is disposed above a corresponding row of pixel units, and a first insulating layer is disposed between each of the plurality of first metal patterned sections and the corresponding row of pixel units;
a second metal wire layer including a plurality of initial signal lines and a plurality of second metal patterned sections, wherein each of the plurality of initial signal lines is connected to each of the pixel units in a corresponding row, and a portion of each of the plurality of second metal patterned sections is overlapped with one of the plurality of first metal patterned sections to form a first capacitor, and with a third insulating layer disposed between another portion of each of the plurality of second metal patterned sections which does not overlap with a corresponding one of the plurality of first metal patterned sections; and
a third metal wire layer including a plurality of connection signal lines connected to the first scan signal line of a current row of pixel units and to the second scan signal line of a next row of pixel units and a plurality of third metal patterned sections, with a portion of each of the plurality of third metal patterned sections overlapped with one of the plurality of second metal patterned sections to form a second capacitor connected to one of the first capacitors in parallel, and with a second insulating layer disposed between another portion of each of the plurality of third metal patterned sections which is not overlapped with a corresponding one of the plurality of second metal patterned sections.

2. The pixel structure as claimed in claim 1, further comprising a control driving module mounted to a side of the pixel unit layer and connected to the plurality of control signal lines, wherein the control driving module is configured to generate a control signal transmitted through one of the plurality of control signal lines to the corresponding row of pixel units.

3. The pixel structure as claimed in claim 1, further comprising a scan driving module mounted to each of two sides of the pixel unit layer, wherein the scan driving modules is connected to two ends of each of the plurality of first scan signal lines to generate a scan signal transmitted through one of the plurality of first scan signal lines to a corresponding pixel unit.

4. The pixel structure as claimed in claim 1, further comprising a substrate and a buffer register layer disposed on the substrate, wherein the pixel unit layer, the first metal wire layer, the second metal wire layer, and the third metal wire layer are disposed on the buffer register layer.

5. The pixel structure as claimed in claim 4, further comprising a second insulating layer disposed on an upper surface of the buffer register layer.

6. The pixel structure as claimed in claim 1, further comprising a fourth metal wire layer including a plurality of data signal lines, wherein each of the plurality of data signal lines connected to a corresponding column of the pixel units.

7. The pixel structure as claimed in claim 6, further comprising a data driving module mounted to a side of the pixel unit layer and connected to the plurality of data signal lines, wherein the data driving module is configured to generate a data signal transmitted through one of the plurality of data signal lines to the pixel units in the corresponding column.

8. The pixel structure as claimed in claim 1, wherein each of the pixel units in the pixel unit array includes a pixel circuit having a pre-charging module, with the pre-charging module including an input end connected to a light-emitting diode and an output end connected to a first electrode of a pre-charging transistor, with the pre-charging transistor including a second electrode connected to the plurality of initial signal lines, and with the pre-charging transistor further including a gate connected to the plurality of second scan lines.

* * * * *